United States Patent [19]

Kosugi et al.

[11] Patent Number: 5,168,192

[45] Date of Patent: Dec. 1, 1992

[54] PRESSURE SENSOR FOR USE IN INTERNAL COMBUSTION ENGINE

[75] Inventors: Masahide Kosugi; Hitoshi Goto, both of Toyota, Japan

[73] Assignee: Toyota Jidosha Kabushiki Kaisha, Toyota, Japan

[21] Appl. No.: 763,137

[22] Filed: Sep. 20, 1991

[30] Foreign Application Priority Data

Sep. 21, 1990 [JP] Japan .................. 2-253859

[51] Int. Cl.$^5$ .......................... H01L 41/08
[52] U.S. Cl. ........................ 310/338; 73/715; 310/324
[58] Field of Search ............... 310/324, 338, 341, 340, 310/344; 73/700, 708, 715, 723, 724, 744, 745, 753, 754

[56] References Cited

U.S. PATENT DOCUMENTS

| | | | |
|---|---|---|---|
| 2,096,826 | 2/1936 | Schrader | 310/338 |
| 2,917,642 | 12/1959 | Wright et al. | 310/338 |
| 3,686,545 | 8/1972 | Shoji | 437/209 |
| 3,956,939 | 5/1976 | Bank et al. | 73/744 |
| 4,010,679 | 3/1977 | Dybel | 310/338 |
| 4,126,801 | 11/1978 | Corbett | 310/338 |
| 4,239,088 | 12/1980 | Check et al. | 310/338 |
| 4,563,906 | 1/1986 | Mathias | 73/208 |
| 4,567,395 | 1/1986 | Pundarika | 310/338 |
| 4,570,097 | 2/1986 | Shunkla et al. | 310/338 |
| 4,590,400 | 5/1986 | Shunkla et al. | 310/338 |
| 4,644,181 | 2/1987 | Mosconi et al. | 310/338 |
| 4,645,965 | 2/1987 | Paganelli | 310/338 |

FOREIGN PATENT DOCUMENTS

| | | | |
|---|---|---|---|
| 1150645 | 5/1956 | France | 73/715 |
| 0474761 | 8/1969 | Switzerland | 73/744 |

*Primary Examiner*—Mark O. Budd
*Assistant Examiner*—Thomas M. Dougherty
*Attorney, Agent, or Firm*—Kenyon & Kenyon

[57] ABSTRACT

A pressure sensor for use in an internal combustion engine includes a diaphragm member having a cylindrical part and a pressure receiving part which is subjected to an axial motion in an axial direction of the diaphragm member when a pressure in an external environment is applied to the pressure receiving part, a pressure detection member having pressure distributing parts and a piezoelectric part for generating a signal indicative of the applied pressure when it is stressed in response to the axial motion of the pressure receiving part, and a pressure transfer member for transferring the motion from the pressure receiving part to the pressure detection member, the pressure transfer member including a spherical member capable of rolling relative to the diaphragm member in a direction perpendicular to the axial direction of the diaphragm member at a position between the pressure receiving part and the pressure detection member.

7 Claims, 8 Drawing Sheets

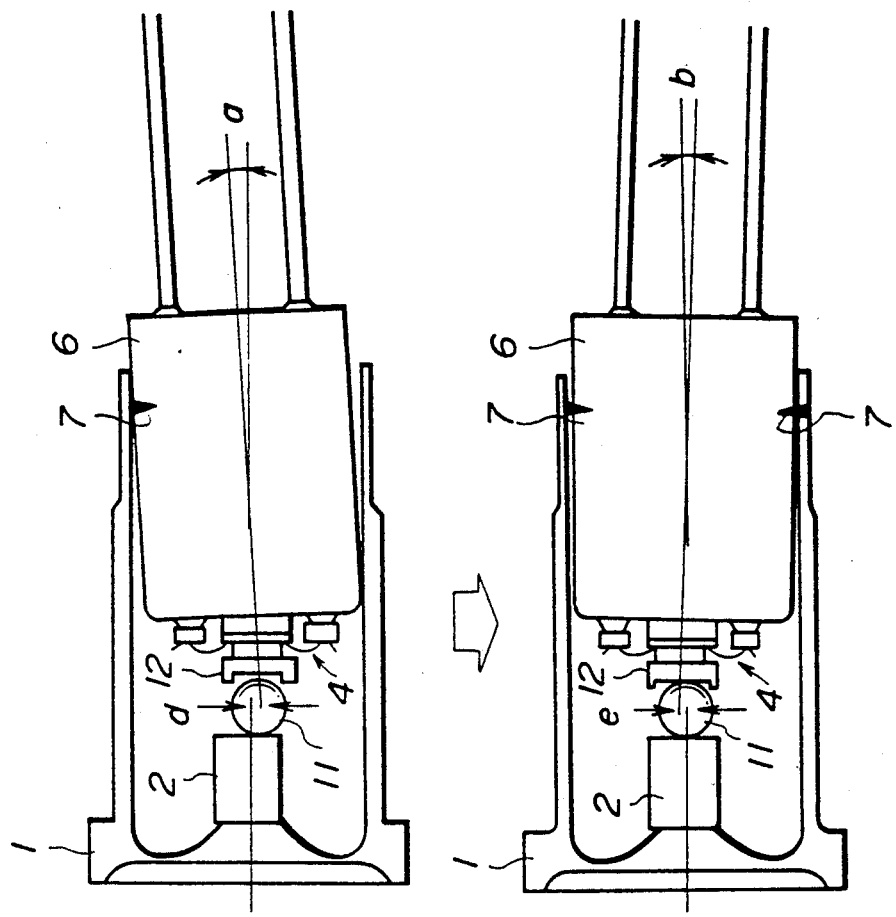

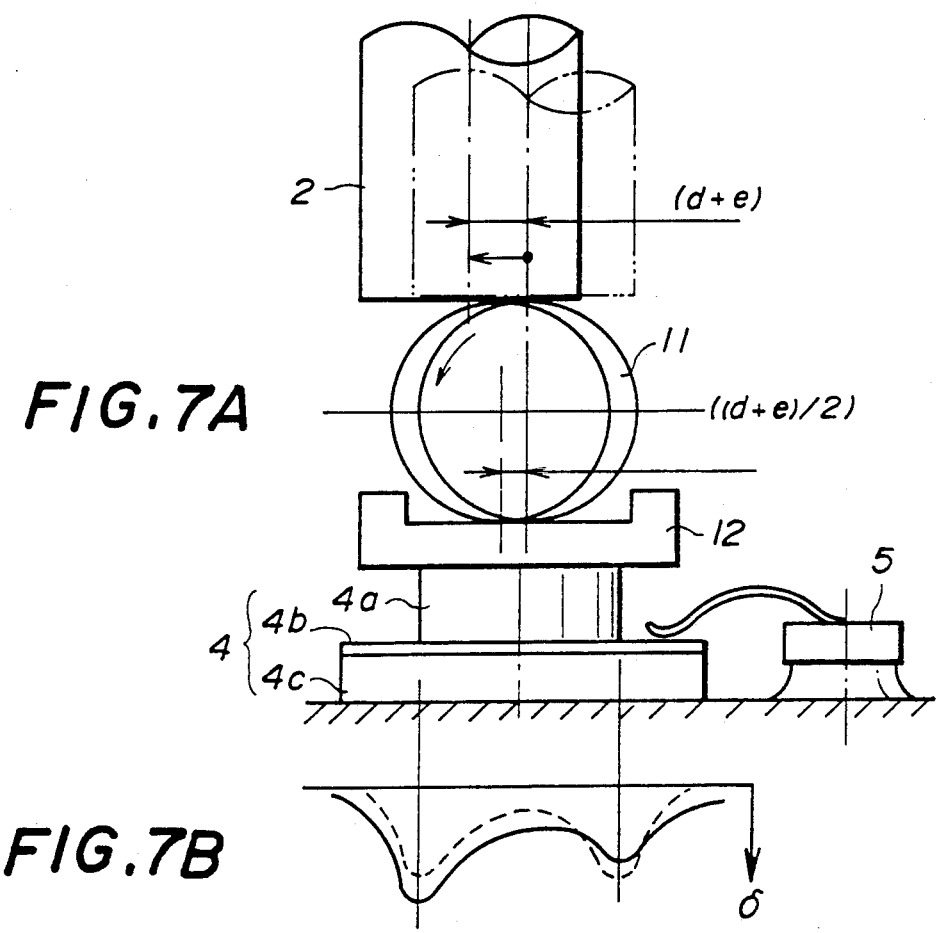

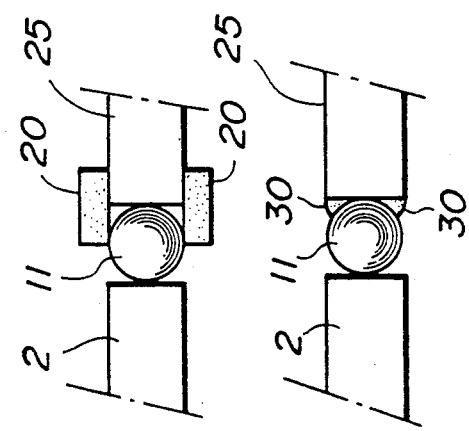

PRESSURE SENSOR FOR USE IN INTERNAL COMBUSTION ENGINE

BACKGROUND OF THE INVENTION (1) Field of the Invention

The present invention generally relates to a pressure sensor for use in an internal combustion engine, and more particularly to a pressure sensor for detecting a pressure of a portion in an internal combustion engine.

(2) Description of the Related Art

A conventional internal combustion engine which is equipped with an electronic control type fuel injector uses several types of pressure sensors. In the internal combustion engine with the electronic control type fuel injector, a basic fuel injection time for which the fuel injector injects fuel is calculated on the basis of an intake manifold pressure and an engine speed in the internal combustion engine which are detected by the sensors, and an air-fuel ratio of air-fuel mixture fed into a combustion chamber of an engine cylinder is controlled so that the air-fuel ratio is maintained to a desired air-fuel ratio. For instance, a vacuum sensor is provided in the engine for detecting the above mentioned intake manifold pressure in an intake passage of the engine, a combustion chamber pressure sensor is used for detecting a pressure in the combustion chamber of the engine cylinder, and a supercharged pressure sensor is provided in the engine with a supercharger for detecting a supercharged pressure in the combustion chamber of the engine cylinder. In some cases, an altitude correction sensor is used for providing an electrical signal in response to an atmospheric pressure at high altitudes, and the atmospheric pressure is corrected by the electrical signal so as to obtain a corrected atmospheric pressure to be used in the engine environment. These sensors of the type mentioned above including the vacuum sensor, the combustion pressure sensor, the supercharged pressure sensor and the altitude correction sensor are hereinafter called a pressure sensor, and in the pressure sensor a piezoelectric element is usually used which generates an electrical signal when it is stressed by a pressure force applied. By receiving this electrical signal from the piezoelectric element, it is possible to detect the pressure applied on a portion in the internal combustion engine at which the pressure sensor is located.

FIG. 1 shows a conventional pressure sensor which is disclosed, for example, in Japanese Patent Application No. 2-130986, and this pressure sensor includes a diaphragm member 1 for converting pressure into mechanical force, the diaphragm member 1 having a pressure receiving part, and a heat insulator 2 for shielding the inside of the pressure sensor from the high-temperature engine environment and for transferring the force from the diaphragm member 1 to a pressure detection part of the pressure sensor by means of a motion of the heat insulator 2 relative to the the pressure detection part of the pressure sensor.

This pressure detection part includes a hemispheric member 3, a piezoelectric member 4, hermetic terminals 5 and a stem 6. The hemispherical member 3 is provided for eliminating residual stresses and load deviations in a direction perpendicular to the axial direction of the diaphragm member 1. An end surface of the heat insulator 2 is joined to an inwardly raised portion of the diaphragm member 1, and the other end surface thereof is brought into contact with one end surface of the hemispheric member 3. The other end surface of the hemispheric member 3 is brought into contact with and fixed to the piezoelectric member 4. The piezoelectric member 4 has a laminated structure including a glass plate 4a, a silicon plate 4b and a glass plate 4c, and is provided for generating an electrical signal in response to the axial force given by the hemispheric member 3. The hermetic terminals 5 are fitted in the stem 6, and the stem 6 is welded to the inside surface of a cylindrical part of the diaphragm member 1. One end surface of the piezoelectric member 4 is mounted on and joined to an end surface of the stem 6. The hermetic terminals 5 serve to pick up the signal generated by the piezoelectric member 4, and the signal is supplied to an external unit via the hermetic terminals 5, so that a pressure in an external environment applied to the diaphragm member 1 is detected.

The stem 6 is welded to the cylindrical part of the diaphragm member 1 through a laser welding process during application of a predetermined constant preload to the pressure receiving part of the diaphragm member 1 from the pressure detection member 4 through the pressure transfer members 2, 3, and those parts are assembled to a condition as shown in FIG. 1 and the applied preload force is retained after the welding is completed. However, it is difficult to keep the axis of the piezoelectric member 4 (or the stem 6) straightly in accordance with the axis of the diaphragm member 1 before and after the welding process. Generally speaking, at the start of the laser welding process, the axis of the piezoelectric member 4 is inclined at an angle "a" with respect to the axis of the diaphragm member 1, as shown in FIG. 2A. The laser welding process is performed so that the stem 6 is permanently joined to the cylindrical part of the diaphragm member 1 by a continuous weld throughout the periphery of the stem 6 at a position 7, as indicated in FIG. 2B. In a case in which the axial direction of the piezoelectric member 4 is inclined at an angle "a" with respect to the axial direction of the diaphragm member 1 at the start of the laser welding, the piezoelectric member's axial direction is, at the ned of the laser welding, inclined at an angle "b" with respect to the diaphragm member's axial direction. Thus, in the course of the laser welding, an inclination angel "a+b" of the piezoelectric member 4 with respect to the axis of the diaphragm member 1 is produced, and owing to the inclination angle, a lateral displacement "d+e" of the axis of the piezoelectric member 4 relative to the axis of the diaphragm member 1 takes place as indicated in FIGS. 2A and 2B.

Although the hemispherical member 3 is provided for preventing a deviating load force from being applied to the piezoelectric element 4 eccentrically form the axial direction of the diaphragm member 1 so as to absorb the above inclination thereof at assembly, one end surface of the hemispherical member 3 is permanentyl joined to teh piezoelectric member 4 and a predetermined constant preload is imparted to the diaphragm member 1 in the axial direction when the stem 6 is welded to the cylindrical part of the diaphragm member 1. Due to the preload applied to the pressure receiving part, the hemispherical member 3 in contact with the heat insulator 2 is not subjected to sliding or motion relative to the heat insulator 2. As a result, the transverse motion of the member 3 is prevented due to the preload, and the inclination of the stem 6 or the lateral displacement (d+e) of the piezoelectric member 4 cannot be absorbed after the laser welding is completed, and the conventional pressure sensor experiences inevitably the above mentioned load deviation, despite the presence of the hemispherical member 3.

FIG. 3A is a diagram for explaining the problems of the conventional pressure sensor and the manufacturing method thereof. In FIG. 3A, it is assumed that the heat insulator 2 is freely moved in relation to the axis of the hemispherical member 3 whose bottom is joined to the piezoelectric member 4. When the heat insulator 2 is shifted from a position indicated by a phantom line in FIG. 3A to a position indicated by a solid line in FIG. 3A in relation to the axis of the piezoelectric member 4 in the course of the above laser welding, a frictional force between the heat insulator 2 and the hemispherical member 3 is produced as a reaction to the lateral displacement described above. Because the frictional coefficient regarding this frictional force is large, the heat insulator 2 does not slide adequately relative to the top of the hemispherical member 3. Therefore, residual stresses on the piezoelectric member 4 are produced as indicated by a solid line in FIG. 3B, and the piezoelectric member 4 experiences load deviations in a direction perpendicular to the axis thereof. A dotted line in FIG. 3B indicates the ideal stress distribution in the piezoelectric member 4 of the conventional apparatus.

In order to prevent the lateral displacement of the axis of the piezoelectric member 4 from being produced, an improved method of producing a pressure sensor has been used in the prior art. FIGS. 4A through 4D show such an improved manufacturing method of the pressure sensor. As shown in FIG. 4A, the diaphragm member 1 is fixed on a work rest and the stem 6 in which the hermetic terminals 5 are fitted is inserted into the diaphragm member 1. The laser welding is performed while a predetermined constant preload is applied to the diaphragm member 1 from the stem 6 through the hemispherical member 3. This laser welding is performed simultaneously at three positions 8a, 8b, 8c on the outer periphery of the stem 6, as in a sectional view shown in FIG. 4B. The diaphragm member 1 to which the stem is welded at the positions 8a, 8b, 8c is then rotated by a given rotation angle about the axis of the stem 6 as shown in FIG. 4C, and the laser welding is again performed to weld the stem 6 simultaneously at three other positions 8d, 8e, 8f on the outer periphery of the stem 6 as in a sectional view shown in FIG. 4D. The stem 6 is welded to the cylindrical part of the diaphragm member 1 by performing repeatedly the three-point simultaneous welding process. According to this improved manufacturing method, the above mentioned inclination angle of the axis of the piezoelectric member 4 as a result of the welding process can be reduced to a smaller level than that when the conventional manufacturing method is used.

However, in a case in which the axis of the stem 6 is initially inclined at an angle with the axis of the diaphragm member 1 before the preload is imparted to the pressure receiving part, or in a case in which the welded portions shrink at different shrinkage rates after the laser welding is performed, the axis of the piezoelectric member 4 actually slant at an angle with the axis of the diaphragm member 1 if the improved manufacturing method is used. Thus, there is a problem in that the conventional pressure sensor may provide an inaccurate pressure-responsive signal due to the inclination of the axis of the piezoelectric member 4.

SUMMARY OF THE INVENTION

Accordingly, it is a general object of the present invention to provide an improved pressure sensor in which the above described problems are eliminated.

Another and more specific object of the present invention is to provide a pressure sensor in which an inclination angle between the axis of the pressure detection part and the axis of the pressure receiving part is minimized by reducing a frictional force between pressure transfer members. The above mentioned objects of the present invention are achieved by a pressure sensor which comprises a diaphragm member having a cylindrical part and a pressure receiving part, the pressure receiving part being subjected to a motion in an axial direction of the diaphragm member when a pressure in an external environment is applied to the pressure receiving part, a pressure detection member having a piezoelectric part and pressure distributing parts, the piezoelectric part being interposed between the pressure distributing parts and pressed by the pressure distributing parts, the piezoelectric part generating a signal indicative of the applied pressure when the piezoelectric part is stressed in response to the motion of the pressure receiving part, and a pressure transfer member provided between the pressure receiving part of the diaphragm member and the pressure detection member for transferring the motion of the pressure receiving part to the pressure detection member in the axial direction of the diaphragm member, the pressure transfer member including a spherical member capable of rolling relative to the pressure receiving part in a direction perpendicular to the axial direction of the diaphragm member at a position between the diaphragm member and the pressure detection member. According to the present invention, a spherical pressure transfer member is provided between the pressure receiving part and the piezoelectric part, and when the axis of the pressure detection member is inclined with the axis of the diaphragm member so as to produce a lateral displacement, the spherical pressure transfer member rolls relative to the diaphragm member in a direction perpendicular to the axis of the diaphragm member in response to the lateral displacement due to the inclination of the pressure detection member. Therefore, it is possible that almost no frictional force occurs between the pressure receiving part and the spherical pressure transfer member. Also, when a stem on which the pressure detection member is mounted is, in a manufacturing process, welded to the cylindrical part of the diaphragm member while a predetermined preload is imparted to the pressure receiving part from the pressure detection member, the spherical member can roll relative to the diaphragm member in the perpendicular direction. Thus, if an inclination angle takes place between the axes of the pressure detection member and the diaphragm member, the inclination angle can be reduced owing to the rolling movement of the spherical member, and therefore the stem on which the pressure detection member is mounted can be welded to the cylindrical part of the diaphragm member with almost no inclination angle to the axis of the diaphragm member. According to the pressure sensor of the present invention, it is possible to eliminate load deviations due to the inclination of the pressure detection member as well as load deviations or residual stresses due to the lateral displacement of the axis of the pressure detection member.

Other objects and further features of the present invention will become more apparent from the following detailed description when read in conjunction with the accompanying drawings.

BRIEF DESCRIPTION OF THE DRAWINGS

FIGS. 6A and 6B are schematic diagrams for explaining a manufacturing method of a pressure sensor according to the present invention;

FIGS. 7A and 7B are diagrams for explaining the advantageous features of the pressure sensor according to the present invention; and FIGS. 8A and 8B are schematic diagrams for explaining modified examples of the pressure sensor according to the present invention.

DESCRIPTION OF THE PREFERRED EMBODIMENTS

Figure 1:
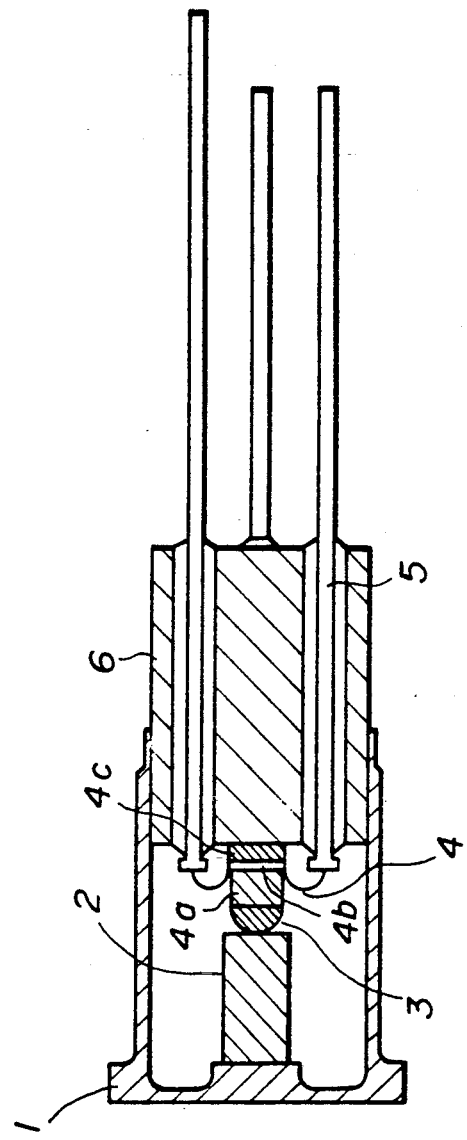
FIG. 1 is a sectional view showing a conventional pressure sensor.
Figures 2A, 2B:
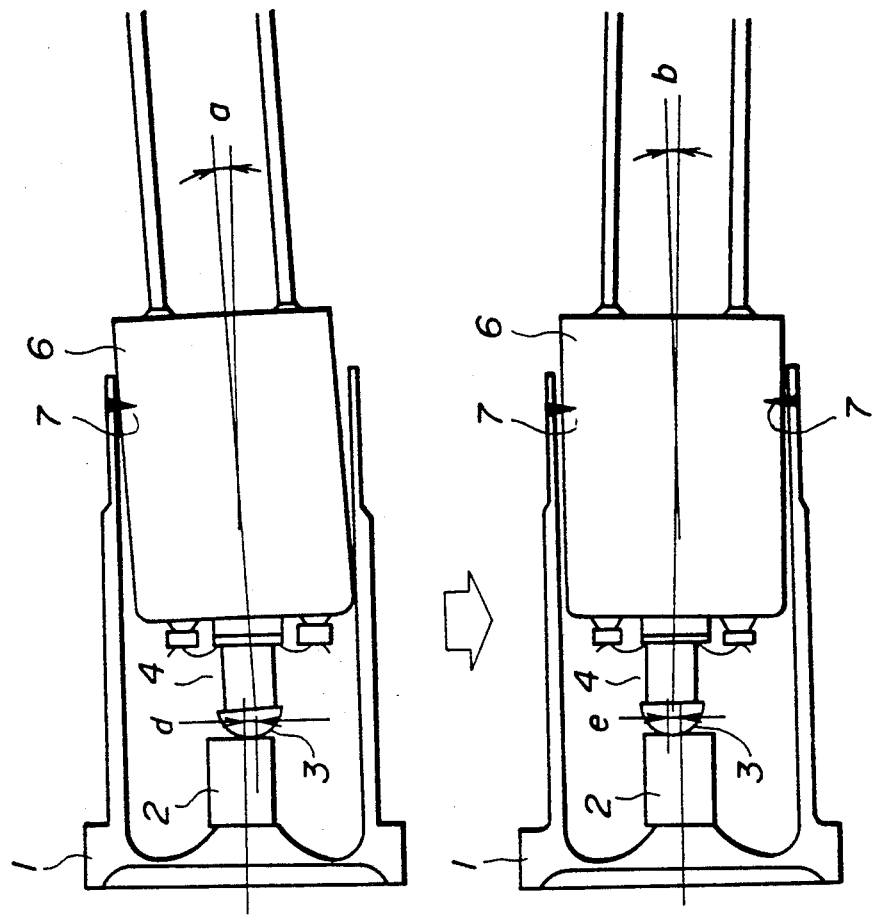
FIGS. 2A and 2B are schematic diagrams for explaining a conventional manufacturing method of the pressure sensor.
Figure 3A:
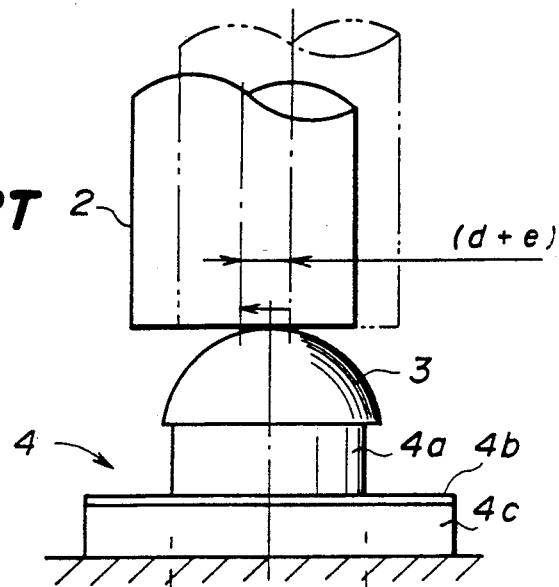
FIGS. 3A and 3B are diagrams for explaining problems of the conventional pressure sensor and the manufacturing method thereof.
Figure 3B:
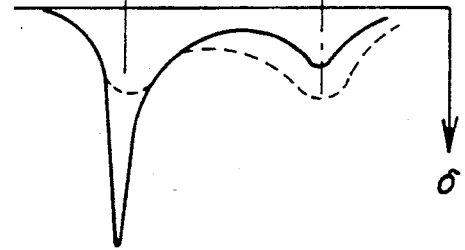
Figure 4A:
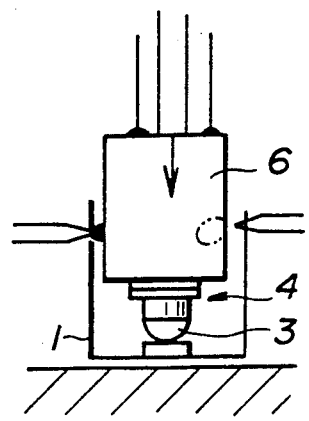
FIGS. 4A through 4D are diagrams for explaining another conventional manufacturing method of the pressure sensor.
Figure 4B:
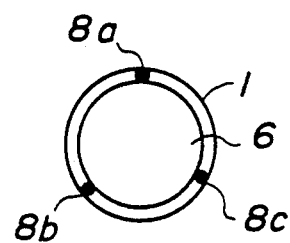
Figure 4C:
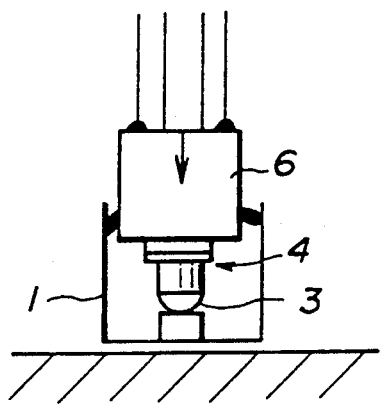
Figure 4D:
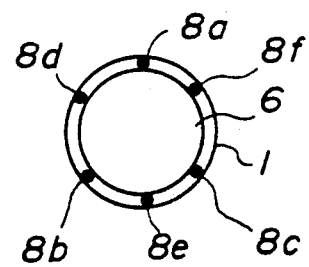
Figure 5:
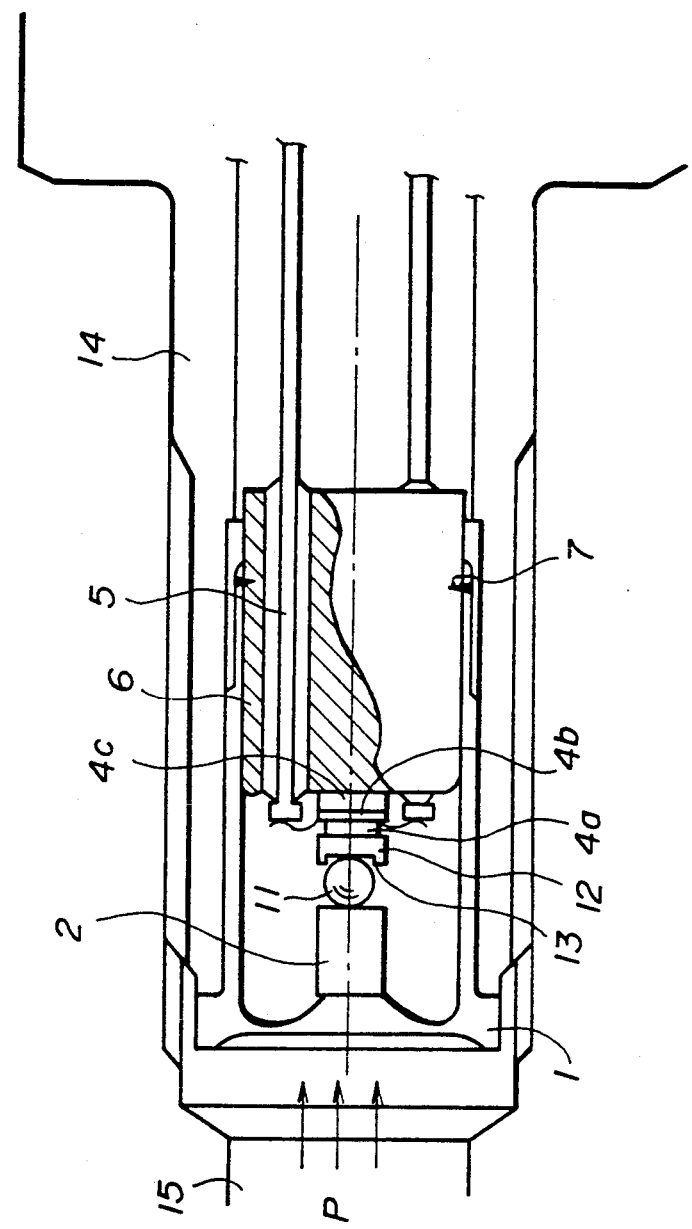
FIG. 5 is a sectional view showing an embodiment of a pressure sensor according to the present invention.

A description will now be given of a preferred embodiment of a pressure sensor according to the present invention, with reference to FIG. 5. In FIG. 5, those parts which are essentially the same as those corresponding parts shown in FIG. 1 are designated by the same reference numerals, and a description thereof will be omitted. The diaphragm member 1 of this pressure sensor shown in FIG. 5 is made of a metal material and has a generally cup-shaped cross section as shown in FIG. 5. This diaphragm member 1 has a cylindrical part to which the stem 6 is welded while a predetermined constant preload is applied, and a base part at a bottom central portion of the cup-shaped diaphragm member 1 which is resiliently deformable in a pressure sensing direction of the pressure sensor, or is subjected to a motion in the axial direction of the diaphragm member 1 when a pressure in an external environment is imparted to the base part. The base part of the diaphragm member 1 forms the pressure receiving part of the present invention.

The heat insulator 2 is a rod member made of a zirconia material, so that the motion of the base part of the diaphragm member 1 is transmitted to the piezoelectric member and external heat is prevented from being transmitted to the inside of the pressure sensor. The heat insulator 2 has a flat end surface at both ends of the heat insulator 2, and one of the two end surfaces is permanently joined to the base part of the diaphragm member 1. The piezoelectric member 4 includes the glass plates 4a, 4c for pressing the silicon plate 4b interposed therebetween, and the silicon plate 4b for converting the heat insulator's motion in the axial direction of the diaphragm member 1 into an electrical signal. The silicon plate 4b is a piezoelectric element which generates an electrical signal when it is stressed in response to the axial motion from the pressure receiving part, on the basis of a known semiconductor strain gage principle, and this silicon plate 4b forms the essential part of the pressure detection member of the invention. The glass plates 4a, 4c form the pressure distributing parts of the invention.

The pressure sensor shown in FIG. 5 includes a spherical member 11 and a supporting member 12 which form the pressure transfer member of the present invention. This spherical member 11 is made of ceramic material or steel, and is placed in contact with the top portion of the heat insulator 1. The spherical member 11 is placed in contact with a recess portion of the supporting member 12, and the top portion of the supporting member 12 is permanently joined to the piezoelectric member 4. A gel material or adhesive agent 13 is previously applied to the recess portion of the supporting member 12 so that the spherical member 11 is centered in and temporarily fixed to the recess portion initially in the manufacturing process for the pressure sensor. The stem 6 on which the piezoelectric member 4 is mounted is snugly fitted in and welded to the cylindrical part of the diaphragm 1 at the position 7 through a laser welding process. The hermetic terminals 5 are electrically connected to the silicon plate 4b and hermetically fitted in the stem 6 for picking up the signal indicative of the applied pressure generated by the piezoelectric member 4. The heat insulator 2, the spherical member 11 and the supporting member 12 described above form the pressure transfer member of the invention.

The pressure sensor is thus constructed and accommodated in a hollow space of a housing 14. The bottom edge of the housing 14 is threaded on the outer circumference thereof, and the housing 14 in which the pressure sensor is accommodated is mounted, for example, on a cylinder block 15 of the engine, such that the housing 14 is secured by the threaded portion to the cylinder block 15 and projects into an internal wall of the cylinder block 15. When a pressure in a combustion chamber of the engine is applied to the base part of the diaphragm member 1, the base part resiliently deforms and is subjected to the motion in the axial direction of the diaphragm member 1 in response to the applied pressure. The motion or force of the diaphragm member 1 is transmitted to the silicon plate 4b as the piezoelectric element through the heat insulator 2, the spherical member 11, the supporting member 12 and the glass plate 4a. In response to the transmitted motion or force, the silicon plate 4b generates a signal indicative of the applied pressure, and this signal can be obtained through the hermetic terminals 5.

Next, a description will be given of an improved manufacturing method of the pressure sensor according to the present invention. In the manufacturing method of the present invention, as shown in FIG. 6A, one end surface of the heat insulator 2 is bonded with adhesive agent to the base part of the diaphragm member 1, and the spherical member 11 which is centered in the recess portion of the supporting member 12 is brought into contact with the other end surface of the heat insulator 2. The supporting member 12 is permanently joined to the piezoelectric member 4, and the piezoelectric member 4 is also permanently joined to the stem 6. While a predetermined constant preload is imparted to the diaphragm member 1 from the stem 6, the outer peripheral surface of the stem 6 is welded at the position 7 to the inner peripheral surface of the cylindrical part of the diaphragm member 1 through a laser welding process, as shown in FIG. 6A. In this manner, the stem 6 is welded throughout the periphery of the stem 6 to the inner peripheral portion of the cylindrical part of the diaphragm member 1 at the position 7, while the preload force is imparted to the diaphragm member 1 from the stem 6. FIG. 6B shows the pressure sensor in a condition immediately after the laser welding process is completed. In the manufacturing process of the invention, the pressure sensor is thus produced through the laser welding process.

Generally speaking, the axial direction of the piezoelectric member 4 at the beginning of the laser welding process is, as shown in FIG. 6A, inclined at an angle "a" with respect to the axial direction of the diaphragm member 1, and it is inclined at an angle "b" with respect to the axial direction of the diaphragm member 1 at the end of the laser welding process, as shown in FIG. 6B. The lateral displacement (d+e) of the axis of the piezoelectric member 4 from the axial direction of the diaphragm member 1 is thus produced due to the inclination angle (a+b) of the piezoelectric member 4. In this case, it can be assumed that the heat insulator 2 is radially shifted by a distance equal to the lateral displacement (d+e) from a position indicated by a phantom line in FIG. 7A to a position indicated by a solid line in FIG. 7A in the course of the laser welding process. According to the present invention, in response to the lateral displacement (d+e), the spherical member 11 rolls relative to the diaphragm member 1 in a direction perpendicular to the axis of the diaphragm member 1. The direction in which the spherical member 11 rolls is the same as the direction in which the heat insulator 2 is assumedly shifted. A contact point between the heat insulator 2 and the spherical member 11 is also shifted by a distance equal to half the lateral displacement (d+e) relative to the diaphragm member 1, as shown in FIG. 7A. Although the spherical member 11 is tentatively fixed to the supporting member 12 by the gel material or adhesive agent in the recess portion of the supporting member 12, the spherical member 11 actually rolls relative to the heat insulator 2 because the frictional force between the members 2 and 11 is much greater than the adhesive force by the gel material on the member 12. The rolling motion of the spherical member 11 relative to the heat insulator 2 in a direction perpendicular to the axis of the diaphragm member 1 is almost equal to half the lateral displacement (d+e) of the piezoelectric member 4.

Therefore, the stress distribution in the 5 piezoelectric member 4 including the silicon plate 4b in the transverse direction perpendicular to the diaphragm member axis is as indicated by a solid line in FIG. 7B. The ideal stress distribution is indicated by a dotted line in FIG. 7B, and the stress distribution in the piezoelectric member 4 of the present invention does not show excessively great difference from the ideal case, and the pressure sensor has almost no load deviations and residual stresses.

FIGS. 8A and 8B show modified examples of the pressure sensor according to the present invention. One method of supporting the spherical member 11 is to press the spherical member 11 in contact with the heat insulator 2 by a pressure applying member 25 and support the same by sponge members 20 mounted on the pressure applying member 25, as shown in FIG. 8A. Another method is to press the spherical member 11 in contact with the heat insulator 2 by the pressure applying member 25 and support the same at its circumferential portion by a gel material 30 on the end surface of the pressure applying member 25. When these modified assembly methods are used, the center of the spherical member 11 can be placed in accordance with the axial direction of the diaphragm member 1 at assembly, thus reducing stress variations in a radial direction of the piezoelectric member and enabling a high accuracy of the pressure sensor.

As described above, according to the present invention, a spherical pressure transfer member is provided between the pressure receiving part of the diaphragm member and the piezoelectric element of the pressure detection member, and a frictional force between the spherical pressure transfer member and the heat insulator due to the lateral displacement of the axis of the piezoelectric member when the stem is welded to the cylindrical part of the diaphragm member can be reduced. A contact point of the spherical pressure transfer member in contact with the heat insulator is thus shifted in a direction perpendicular to the axis of the piezoelectric member in response to the lateral displacement of the axis of the piezoelectric member. Thus, it is possible for the pressure sensor of the present invention to eliminate load deviations due to the inclination of the pressure detection member as well as load deviations or residual stresses due to the lateral displacement of the axis of the piezoelectric member.

Further, the present invention is not limited to the above described embodiments, and variations and modifications may be made without departing from the scope of the present invention. For example, the stem 6 can be welded to the cylindrical part of the diaphragm member 1 by performing repeatedly the 3-point simultaneous welding process as described above in conjunction with FIGS. 4A to 4D, while a predetermined preload force is imparted to the piezoelectric element 4. Also, the method of supporting the spherical member 11 is not limited to the use of the supporting member 12 described above.

What is claimed is:

1. A pressure sensor comprising:
   diaphragm means having a cylindrical part and a pressure receiving part, said pressure receiving part being subjected to a motion in an axial direction of said diaphragm means when a pressure in an external environment is applied to said pressure receiving part;
   pressure detection means having pressure distributing parts and a piezoelectric part which is interposed between the pressure distributing parts and pressed by the pressure distributing parts, said piezoelectric part generating a signal indicative of said applied pressure when the piezoelectric part is stressed in response to said motion of said pressure receiving part; and
   pressure transfer means provided between said pressure receiving part and said pressure detection means for transferring said motion of said pressure receiving part to said pressure detection means, said pressure transfer means including a spherical member which is capable of rolling relative to said pressure receiving part in a direction perpendicular to said axial direction of said diaphragm means at a position between said diaphragm means and said pressure detection means.

2. The pressure sensor as claimed in claim 1, wherein said pressure detection means is mounted on a stem having a cylindrical peripheral portion, said cylindrical peripheral portion of said stem being welded to said cylindrical part of said diaphragm means while a predetermined preload is imparted in the axial direction of said diaphragm means to said pressure receiving part through said spherical member.

3. The pressure sensor as claimed in claim 1, wherein said pressure transfer means includes a heat insulating member permanently joined to said pressure receiving part, said spherical member placed in contact with said heat insulating member, and a supporting member permanently joined to said pressure detection means, said supporting member having a recess portion on which said spherical member is mounted and supported in said supporting member, said spherical member being subjected to a transverse rolling movement relative to said pressure receiving part in the direction perpendicular to the axial direction of said diaphragm means when a stem on which said pressure detection means is mounted is welded at a peripheral portion of said stem to said cylindrical part while a predetermined preload is imparted in the axial direction of said diaphragm means to said pressure receiving part through said spherical member, thus reducing an inclination angle of the axis of said pressure detection means from the axis of said diaphragm means.

4. The pressure sensor as claimed in claim 1, wherein said pressure transfer means includes a heat insulating member permanently joined to said pressure receiving part, said spherical member placed in contact with said heat insulating member, and a set of sponge members permanently joined to said pressure detection means and supporting said spherical member therebetween, said spherical member being subjected to a transverse rolling movement relative to said pressure receiving part in the direction perpendicular to the axial direction of said diaphragm means when a stem on which said pressure detection means is mounted is welded to said cylindrical part while a predetermined preload is imparted in the axial direction of said diaphragm means to said pressure receiving part through said spherical member, thus reducing an inclination angle of the axis of said pressure detection means from the axis of said diaphragm means.

5. The pressure sensor as claimed in claim 1, wherein said pressure transfer means includes a heat insulating member permanently joined to said pressure receiving part, and said spherical member temporarily fixed to said pressure detection means by an adhesive material thereon, said spherical member being subjected to a transverse rolling movement relative to said pressure receiving part in a direction perpendicular to the axial direction of said diaphragm means when a stem on which said pressure detection means is mounted is welded to said cylindrical part while a predetermined preload is imparted in the axial direction of said diaphragm means to said pressure receiving part through said spherical member, thus reducing an inclination angle of the axis of said pressure detection means from the axis of said diaphragm means.

6. The pressure sensor as claimed in claim 1, further comprising a stem on which said pressure detection means is mounted, said pressure detection means being permanently joined to said stem, said stem being welded at its peripheral portion to said cylindrical part while a predetermined preload is imparted in the axial direction of said diaphragm means to said pressure receiving part.

7. The pressure sensor as claimed in claim 6, further comprising hermetic terminals which are hermetically fitted in said stem member, said hermetic terminals being electrically connected to said piezoelectric part of said pressure detection means so that a signal, generated by said piezoelectric part, indicative of the applied pressure is obtained through said hermetic terminals.

* * * * *

UNITED STATES PATENT AND TRADEMARK OFFICE
CERTIFICATE OF CORRECTION

PATENT NO. : 5,168,192

DATED : December 1, 1992

INVENTOR(S) : Masahide KOSUGI, et al.

It is certified that error appears in the above-indentified patent and that said Letters Patent is hereby corrected as shown below:

Column 2, line 27, change "straightly" to --straight--.

Column 2, line 43, change "ned" to --end--.

Column 2, line 54, change "form" to --from--.

Column 2, line 57, change "permanentyl" to --permanently--.

Column 3, line 63, change "slant" to --slants--.

Signed and Sealed this

Twenty-sixth Day of September, 1995

Attest:

BRUCE LEHMAN

Attesting Officer     Commissioner of Patents and Trademarks